United States Patent [19]

Ozaki

[11] Patent Number: 4,864,779
[45] Date of Patent: Sep. 12, 1989

[54] GRINDING METHOD AND APPARATUS OF ORIENTATION FLAT

[75] Inventor: Haruo Ozaki, Tokyo, Japan

[73] Assignees: Emtec Co., Ltd., Tokyo; Daito Shozi Co., Ltd., Osaka, both of Japan

[21] Appl. No.: 224,525

[22] Filed: Jul. 26, 1988

[30] Foreign Application Priority Data

Aug. 23, 1987 [JP] Japan .................. 62-209840

[51] Int. Cl.$^4$ .................................... B24B 9/08
[52] U.S. Cl. ........................... 51/283 E; 51/95 R
[58] Field of Search ............... 51/283 E, 284 E, 77 R, 51/91 R, 95 R

[56] References Cited

U.S. PATENT DOCUMENTS 4,528,780 7/1985 Halberschmidt ............... 51/283 E

FOREIGN PATENT DOCUMENTS 0137865 10/1980 Japan .................. 51/95 R

Primary Examiner—Frederick R. Schmidt
Assistant Examiner—Jack W. Lavinder
Attorney, Agent, or Firm—Armstrong, Nikaido, Marmelstein, Kubovcik & Murray

[57] ABSTRACT

An apparatus equipped with a round cutter, a rotation drive mechanism for the cutter, a workpiece stand, a rotary servo-mechanism for rotating the workpiece stand, a rectilinear servo-mechanism for letting the workpiece stand get near to or away from the cutter, an input device for enabling an input operation of at least a diameter or a radius of the cutter, a diameter or a radius of the workpiece, a length of a straight portion of an oriental flat of the workpiece and a radius of curvature of a circular-arc portion at its both sides, and a computer computing a distance between a rotation center of the workpiece and a locus generated by a rotation center of the cutter which revolves while making contact with and relatively to the orientation flat of the workpiece forming a machining standard, as a function in relation to a rotation angle of the workpiece, previously memorizing its operation program and electrically connected to the rotary sevo-mechanism, the rectilinear servo-mechanism and the input device. The rotary servo-mechanism and the rectilinear servo-mechanism are controlled by the computer to form the orientation flat by means of a two-axis control of a rotation and an unidirectional movement of the workpiece.

4 Claims, 6 Drawing Sheets

GRINDING METHOD AND APPARATUS OF ORIENTATION FLAT

BACKGROUND OF THE INVENTION

This invention relates to a grinding method and an apparatus of an orientation flat for a disc-like workpiece such as a silicone wafer, and especially to a grinding method and an apparatus in which disadvantages of a conventional copying master system or a three-axis control NC system are improved, grinding by two-axis control is enabled, and reductions in overall dimension and manufacturing cost of the apparatus are accomplished.

A wafer such as a silicone wafer is a generic name of a thin disc-like semiconductor, in which a disc-like plate is cut away from a cylindrical refined single-substance crystal mother material to be ground to a mirror surface, and various semiconductive elements are formed on the surface by means of an etching process etc. In the silicone wafer, its dimensions are such that a diameter ranges from 10 to 400 mm$\phi$, a thickness ranges from 200 microns to 10 mm and its shape is formed into a disc-like shape, and an orientation flat (generally abbreviated to OF) is formed by grinding a part of its outer periphery into a straight edge in order to ease its alignment of circumferential orientation.

On the other hand, what causes a trouble in carrying out a fine machining on the wafer surface is dust produced from the surface or outer peripheral surface of the wafer, and more dust will be produced when the outer peripheral surface of the wafer is sharp. Therefore, if a joining surface between the straight edge of orientation flat and the outer peripheral surface is formed into a circular-arc like shape, this will become an effective measure for controlling the dust.

Machining a wafer diameter and the orientation flat to correct dimensions will lead to a reduction in a positioning time of a fine machining in the next process, so that a high-precision grinding is required thereto.

Conventionally, the copying master system has been employed for one method to machine the straight edge of the orientation flat and both sides circular-arc portion of wafer to correct dimensions. In this system, a master having the same shape as a machining standard (completed product) has been made, and a wafer serving as a workpiece has been ground using a mechanical copying mechanism by copying said master. Therefore, it has been required to newly make a master or at least exchange the master every time the completed shape of wafer is changed, so that a manufacturing cost of the master has been costly and much man-hours have been spent for a preparation work.

When the copying master has not been used, it has been necessary to put in use a general NC grinding machine. In this case, it has been required to use a three-axis control system for a rotation direction ($\theta$), a longitudinal direction (X-axis) and a lateral direction (Y-axis) of the workpiece. It has been general method to machine the circular-arc portion of orientation flat by means of the three-axis control, and the straight portion by means of the X-axis control only. However, since the three-axis control has been indispensable for this system, the entire apparatus has become complicated, large and expensive.

SUMMARY OF THE INVENTION

The present invention is intended to eliminate the above-mentioned disadvantages of the prior art. An object of the invention is to allow all machining on the straight and circular portions of the orientation flat to be carried out by means of the two-axis control in rotation direction ($\theta$) and longitudinal direction (Y-axis), thereby eliminating all the disadvantages accompanied by the conventional copying master system and the three-axis control NC grinding machine. Another object of the invention is to enable a change in dimensions of completed products by only inputting data of a workpiece diameter, a length of straight portion of the orientation flat and a radius of curvature of the circular arc, to ease the preparation work to a large extent, to improve a working efficiency and precision, and to reduce a volume and a weight of the entire apparatus by about 30% as compared with a conventional NC grinding machine. A further object of the invention is to eliminate a possibility of giving damages to a workpiece such as the wafer by fastening the workpiece through means of a suction system utilizing vacuum, and to ease the fastening work. A still further object of the invention is to make it possible as occasion demands to form orientation flats on plural places of the workpiece to manufacture polygonal products such as triangular, square, pentagonal and hexagonal products etc. from the circular disc.

In order to accomplish the above-mentioned objects, this invention provides a grinding method of orientation flat for forming a straight portion on a part of an outer peripheral surface of a disc-like workpiece by means of an outer peripheral surface of a rotated round cutter; characterized by that a distance between a rotation center of said workpiece and a locus generated by a rotation center of said cutter which revolves while making contact with and relatively to the orientation flat of said workpiece forming a machining standard, are obtained as variables of a function in relation to a rotation angle of said workpiece; an operation program of said function is previously memorized in a computer; a diameter or a radius of said cutter, a diameter or a radius of said workpiece, a length of straight portion of said orientation flat and a radius of curvature of a circular-arc portion at both sides thereof are inputted in said computer; said distance corresponding to the rotation angle is computed by said computer while rotating said workpiece by a rotary servo-mechanism controlled by said computer; and said orientation flat is formed only through means of a two-axis control: a rotation control of said workpiece and an unidirectional movement control of said workpiece, by letting said workpiece get near to or away from said cutter through a rectilinear servo-mechanism on the basis of said computed results.

Further, this invention provides a grinding apparatus having a round cutter; a rotation drive mechanism for said cutter; a workpiece stand; a rotary servo-mechanism for rotating said workpiece stand; a rectilinear servo-mechanism for letting said workpiece stand get near to or away from said cutter; an input device for enabling an input operation of at least a diameter or a radius of said cutter, a diameter or a radius of said workpiece, a length of a straight portion of an orientation flat of said workpiece and a radius of curvature of a circular-arc portion at both sides thereof; and a computer computing a distance between a rotation center of said workpiece and a locus generated by a rotation center of said cutter which revolves while making contact with and relatively to the orientation flat of said workpiece forming a machining standard, as a function in relation to a rotation angle of said workpiece, previously memorizing its operation program, and electrically connected to said rotary servo-mechanism, said rectilinear servo-mechanism and said input device; said rotary servo-mechanism and said rectilinear servo-mechanism being controlled by said computer to form said orientation flat by means of a two-axis control of a rotation and an unidirectional movement of said workpiece.

DETAILED DESCRIPTION OF THE PREFERRED EMBODIMENT

Figure 1:
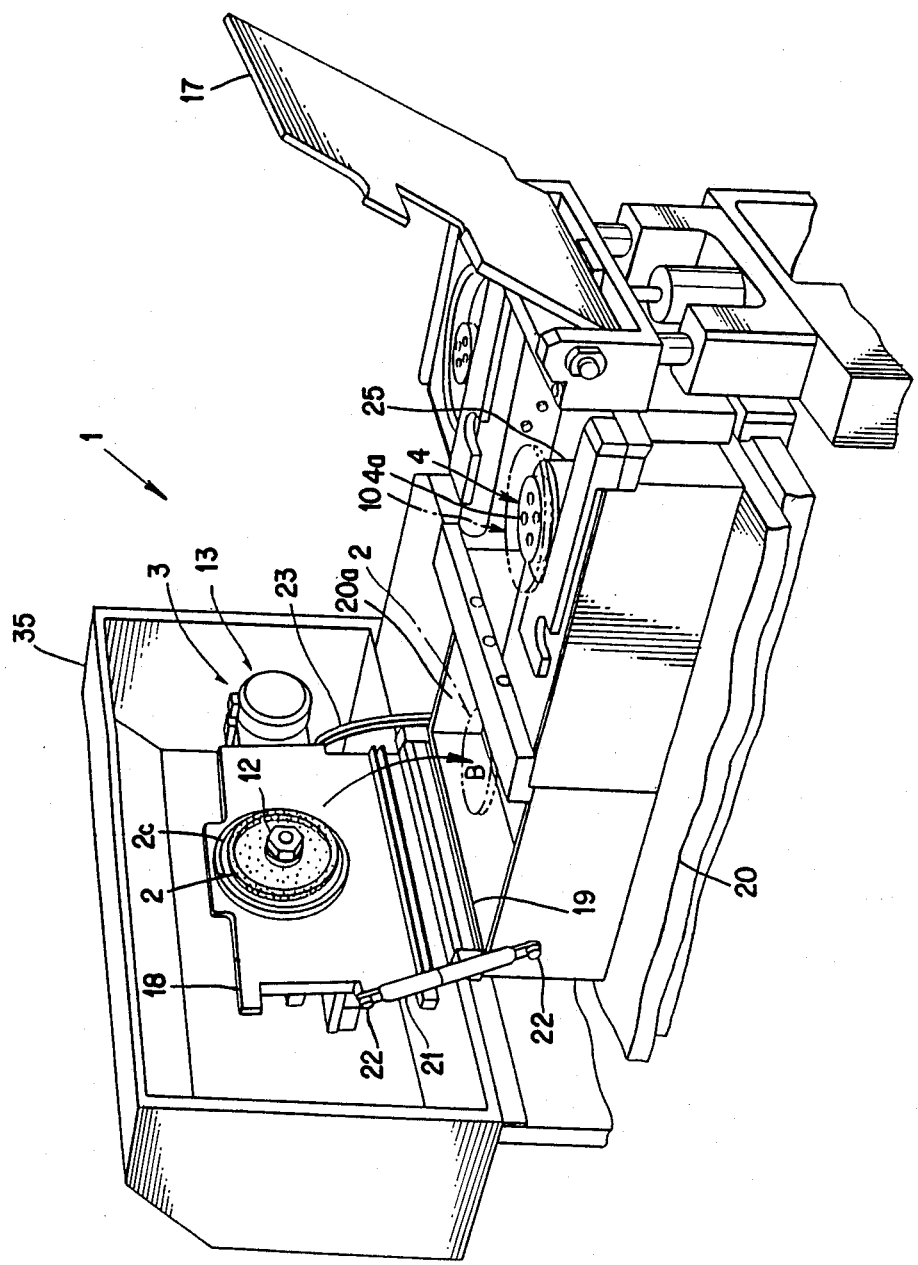
FIG. 1 is an oblique view of an essential part of a grinding apparatus of an orientation flat according to the invention in an unused state.
Figure 2:
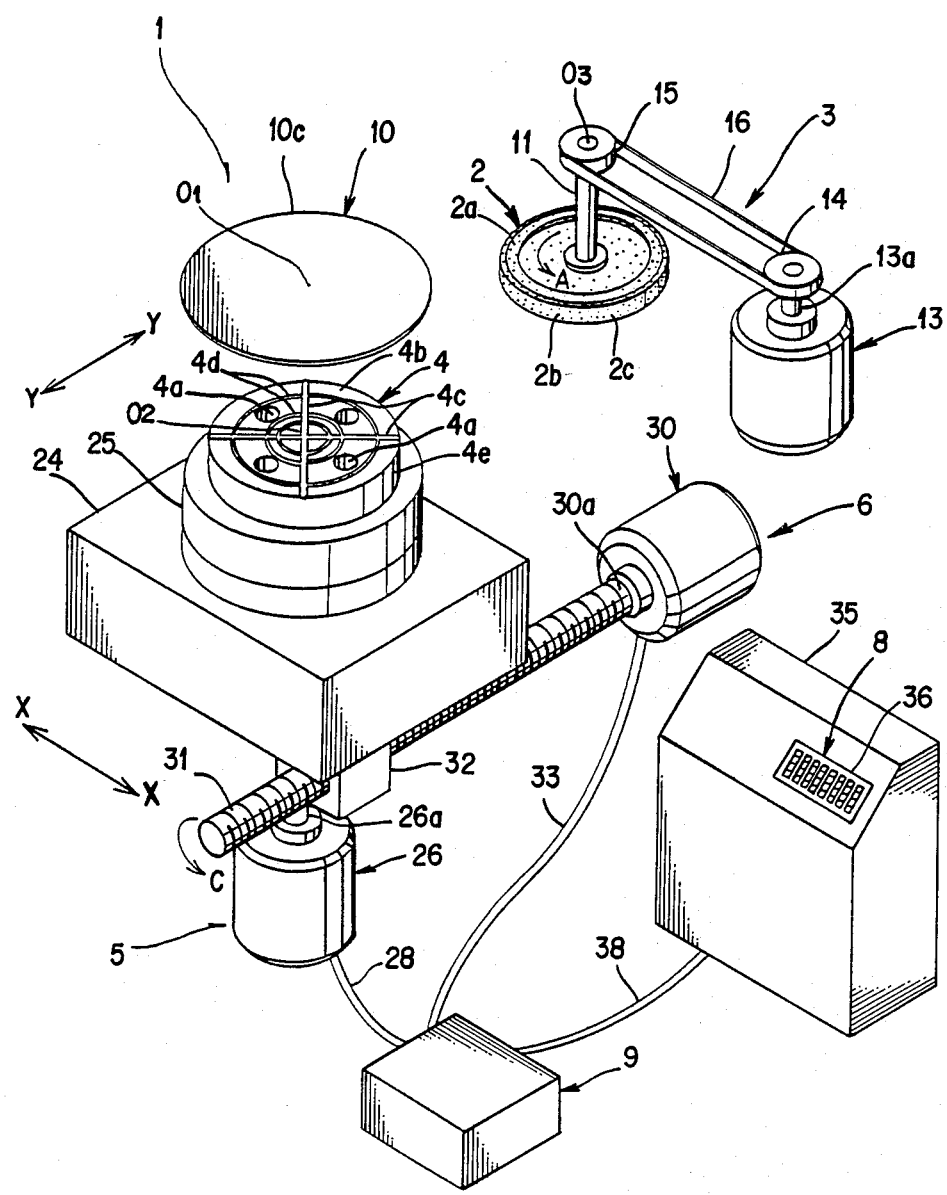
FIG. 2 is a schematic prospective view of an essential part showing a mechanism of the grinding apparatus of the orientation flat according to the invention.
Figure 3:
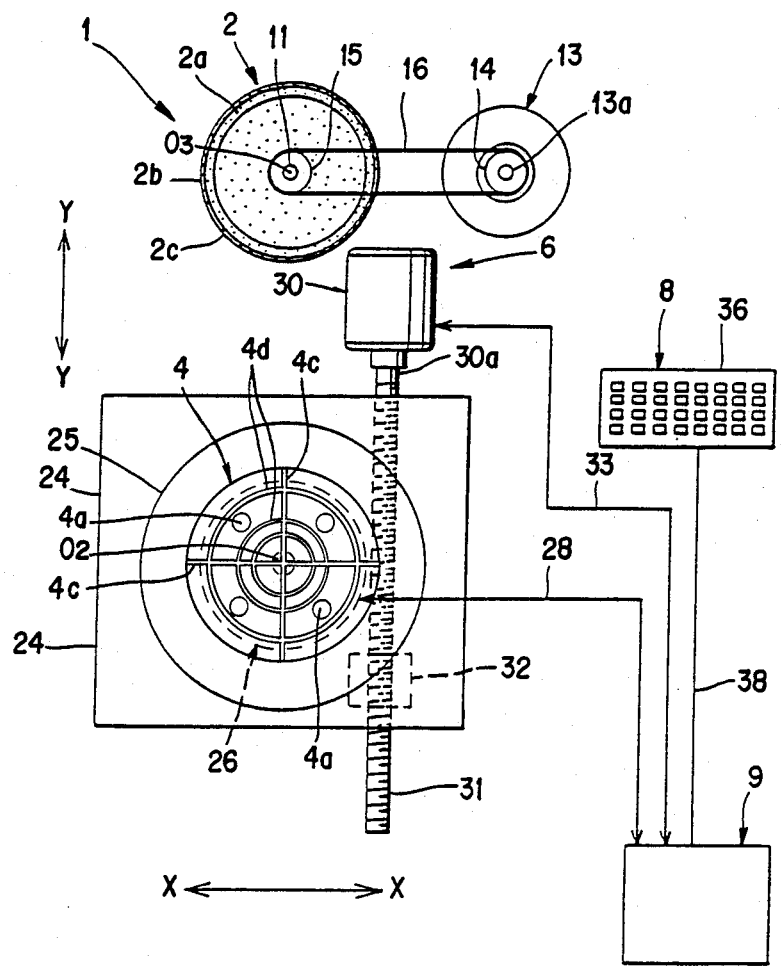
FIG. 3 is a plan view showing the same state as FIG. 2.

In FIG. 1 through FIG. 3, an orientation flat grinding apparatus 1 is equipped with a round cutter 2, a cutter rotation drive mechanism 3, a workpiece stand 4, a rotary servo-mechanism 5, a rectilinear servo-mechanism 6, an input device 8 and a computer 9. The cutter 2 is formed by solidifying diamond grains 2b by means of a metal or an electro-deposition around a cutter body 2a fabricated by pressing emeries. In case for example when a workpiece 10 is a silicone wafer, the cutter 2 is adapted to rotate at a peripheral speed i.e. a grinding speed of about 1300 m/min, and said cutter 2 is secured to a rotating shaft 11 by a nut 12 in a detachable manner. Further, a grain number of #100~#2000 is used for the diamond grain 2b. Moreover, the rotating shaft 11 of the cutter 2 is so constructed that in an operation state it can move only in a rotating direction and not in both X-axis and Y-axis directions at all.

The rotation drive mechanism 3 is composed of an electric motor 13, a pulley 14 fastened to a rotating shaft 13a of said motor 13, and a belt 16 wound around said pulley 14 and a pulley 15 fastened to the rotating shaft 11. A rotation of the electric motor 13 causes the cutter 2 to rotate in a direction of arrow A, for example. Further, in FIG. 1, the cutter rotation drive mechanism 3 is attached to a swing plate 18 to be freely vertically swung onto a bed 20 on the orientation flat grinding apparatus 1 through a hinge mechanism 19, so that it swings downward as shown by an arrow B of FIG. 1 to allow the cutter 2 to be set in a horizontal position. A shock absorber 21 is pivotally installed between the swing plate 18 and the bed 20 by a pair of pins 22 so that the drive mechanism 3 can be swung downward as shown by the arrow B to permit the cutter 2 to be set in place. Moreover, the electric motor 13 is connected to a power supply (not shown) through an electric wire 23. A hollow part 20a to accommodate the cutter 2 for grinding work is formed in the bed 20.

As illustrated in FIG. 2, plural (four, for example) air suction holes 4a are formed on a top face 4b of the workpiece stand 4, and said air suction holes 4a are interconnected to a vacuum pump (not shown) so that air is sucked from said air suction holes 4a by a function of said vacuum pump so as to absorb the workpiece 10. Further, a pair of grooves 4c intersecting at right angles in radial directions and grooves 4d concentrically in circular directions are formed on a top face 4b of the workpiece stand 4. Incidentally, a cut surface (not shown) similar to the orientation flat OF formed on the workpiece 10 may be cut on a part of an outer peripheral surface 4e of the workpiece stand 4. Moreover, although omitted in the figure, an alignment mechanism for aligning a rotation center 01 of the workpiece 10 with a rotation center 02 of the workpiece stand 4 is installed in the workpiece stand 4. Furthermore, the workpiece stand 4 is supported freely rotatably on a support cylinder 25 fixed to a moving stand 24 movable in a Y-axis direction, so that it can slide in the Y-axis direction together with the moving stand 24. Incidentally, as illustrated in FIG. 1, a swingable cover 17 which is pivotally attached to the base 20 to be put in a horizontal position in the operation state, is disposed on the workpiece stand 4.

As seen from FIG. 2 and FIG. 3, the rotary servo-mechanism 5 is for rotating the workpiece stand 4. Its function is to extremely slowly rotate the stand according to a progress of machining of the orientation flat OF, and accomplished by using a servo-motor 26 and directly coupling a rotating shaft 26a of the D.C. servo-motor to the workpiece stand 4. The D.C. servo-motor 26 is electrically connected to the computer 9 through an electric wire 28.

The rectilinear servo-mechanism 6 is for letting the workpiece stand 4 get near to or away from the cutter 2. For instance, a rotating shaft 30a of a D.C. servo-motor 30 is directly coupled to a feed screw 31 and said moving stand 24, thereby the moving stand 24 can be reciprocated only in the Y-axis direction by rotating the feed screw 31 in normal and reverse directions. The D.C. servo-motor 30 is electrically connected to the computer 9 through an electric wire 33. Incidentally, a precision ball screw is used for the feed screw 31 and the feed nut 32.

Figure 4:
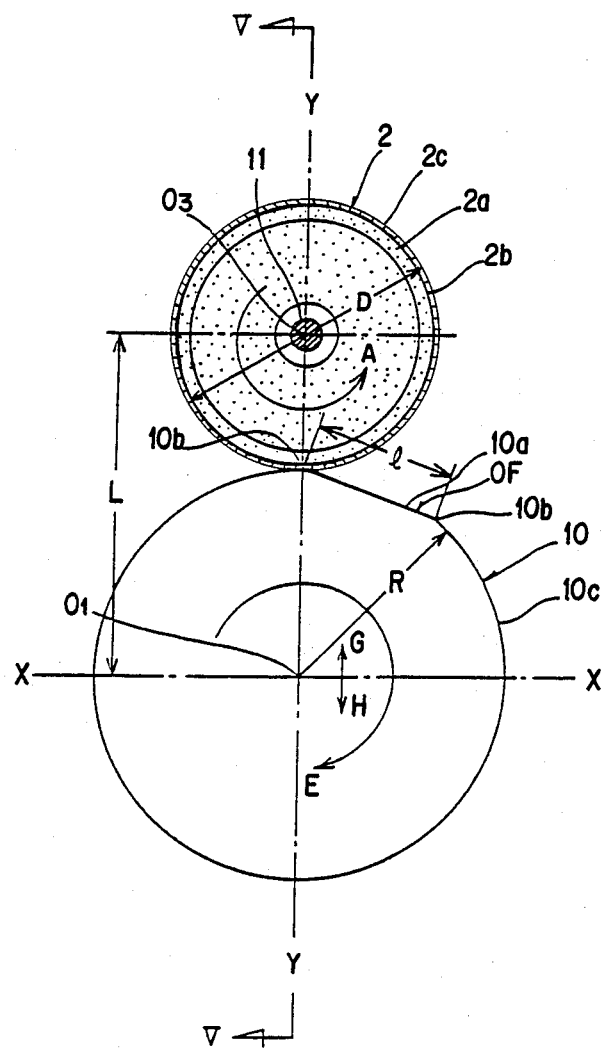
FIG. 4 is a plan view of a cutter and a workpiece showing a grinding state of the invention.

The input device 8 is adapted to input at least a diameter D of the cutter 2, a diameter or radius R of the workpiece 10, a length l of a straight portion 10a of the orientation flat OF (FIG. 4) of the workpiece 10 and a radius of curvature r of circular portions 10b at both sides thereof. The input device is installed, for example, as a key board 36 on an upper cover 35 of the orientation flat grinding apparatus 1 illustrated in FIG. 1, and electrically connected to the computer 9 through a wire 38. Incidentally, it is needless to say that various data such as a rotation speed of the cutter 2, a number of orientation flat OF formed on the workpiece 10 and others can be inputted in the input device 8 in addition to the foregoing data. Further, the grinding apparatus can naturally be so deviced that the diameter D of said cutter 2 is consecutively measured when the cutter 2 is worn out, resulting data are momently inputted in and transmitted to the computer 9, and the rectilinear servo-mechanism 6 is adapted to execute its control in accordance with a wear amount of the cutter 2.

Figure 6:
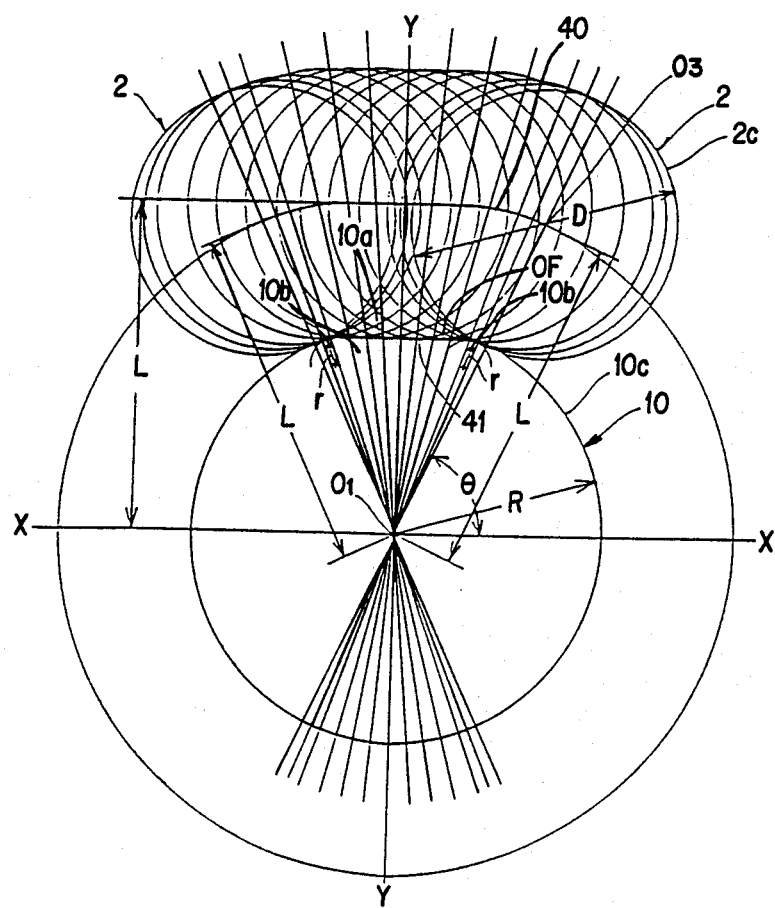
FIG. 6 is a plan view showing a machining principle of a case where the workpiece of the invention is ground by the cutter.

Referring to FIG. 6, the computer 9 computes a distance L between the rotation center 01 of the workpiece 10 and a locus 40 generated by the rotation center 03 of the cutter 2 which revolves while making contact with and relatively to the orientation flat OF of the workpiece 10 (completed product) forming the machining standard, as variables of a function $L=f(\theta)$ relative to a rotation angle $\theta$ of the workpiece 10, and memorizes its operation program. The computer 9 is electrically connected to the rotary servo-mechanism 5, the rectilinear servo-mechanism 6 and the input device 8 respectively.

In FIG. 6, such an envelope 41 just forms the orientation flat OF, that is generated when the cutter 2 revolves while making contact with and relatively to the orientation flat OF of the workpiece 10 forming the machining standard. Further, a position apart from said envelope 41 by a radius D/2 of the cutter 2 in a normal direction just forms the locus 40 generated by the rotation center 03 of the cutter 2. The distance L between the locus 40 and the rotation center 01 of the workpiece 10 is computed in relation to the rotation angle $\theta$ to obtain the function $L=f(\theta)$, and this function is memorized in the computer 9. Then, the computer 9 momently operates and determines the distance L corresponding to the rotation angle $\theta$ of the workpiece 10 and sends a control signal to the rectilinear servo-mechanism 6, i.e. D.C. servo-motor 30, thus being able to control a position of the rotation center 01 of the workpiece 10.

The computer 9 is adapted to control the rotary servo-mechanism 5 and the rectilinear servo-mechanism 6 to form the orientation flat OF by the two-axis control: rotation and unidirectional movement.

The present invention is constructed as mentioned above, and its function will be described hereunder.

As illustrated in FIG. 1, in order to use the orientation flat grinding apparatus 1, the swing plate 18 is first swung down toward the hollow part 20a of the bed 20 to set the cutter rotation drive mechanism 3 in place, and the cutter 2 is set to a horizontal position as illustrated by imaginary lines of FIG. 1. Then, the upper cover 35 is similarly swung down in the direction of arrow B to cover the swing plate and the workpiece 10 is fastened onto the workpiece stand 4 by means of the vacuum absorption. In case for example when the workpiece 10 is a silicone wafer, it is formed into a thin circular disc of true circle. The not-shown alignment mechanism aligns the rotation center 01 of the workpiece 10 with the rotation center 02 of the workpiece stand 4 as illustrated by FIG. 5, the fastening of the workpiece 10 is easily completed, and the cover 17 is put down in the horizontal position.

Before commencing the grinding work, at least the diameter D of the cutter 2, the radius R of the workpiece 10, the length l of straight portion 10a of orientation flat OF and the radius of curvature r of the circular arc portion 10b are to be inputted in the input device 8 (FIG. 2) as illustrated in FIG. 6; and the computer 9 (FIG. 2) will commence its operation by turning a start switch (not shown) on. The control signal from the computer 9 causes the D.C. servo-motor 26 first to commence its rotation at an extremely low speed, and then the workpiece stand 4 and the workpiece 10 to commence their rotations through the rotating shaft 26a. Consequently, the rotation angle $\theta$ of the workpiece 10 is fed back to the computer 9, and the function $L=f(\theta)$ previously memorized in said computer 9 is operated, a distance L appropriate for the rotation angle $\theta$ is operated, and an operated result is sent to the D.C. servo-motor 30 of the rectilinear servo-mechanism 6 as the control signal. Then, said D.C. servo-motor 30 rotates to cause the feed screw 31 to rotate through the rotating shaft 30a in a direction of arrow C of FIG. 2, and the moving stand 24 commences its movement along the Y-axis. The workpiece 10 rapidly approaches the cutter 2, and the rotating speed of the D.C. servo-motor 30 is decelerated by the computer 9 immediately before the workpiece 10 contacts with the cutter to cause an outer peripheral surface 10c of the workpiece 10 to slowly contact with an outer peripheral surface 2c of the cutter 2, thereby the grinding work being commenced.

The workpiece 10 is rotated by the rotary servo-mechanism 5 little by little, and its rotation angle $\theta$ is fed back to the computer 9 which in turn computes the distance L momentarily. The control signal resulting from the operation is sent to the D.C. servo-motor 30 of the rectilinear servo-mechanism 6 to cause the feed screw 31 to rotate correctly. The distance L changes momently, and the circular-arc portion 10b at a right side of the workpiece 10 is first ground. Then, the straight portion 10a is ground. Finally, the circular-arc portion 10b at a left side thereof is ground, thereby the grinding work being completed.

Figure 5:
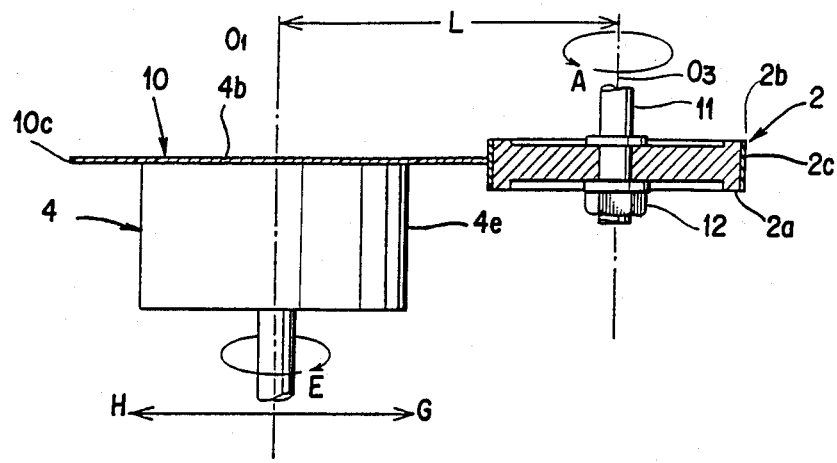
FIG. 5 is a sectional view taken on a line V—V of FIG. 4.

In this case, for example when the workpiece 10 rotates at low speed in a direction of arrow E of FIG. 5 and the cutter 2 rotates in the direction of arrow A, the grinding work is carried out under a down-cut mode. However, it is naturally possible to provide an up-cut mode by reversing the rotation direction of the cutter 2.

In this manner, the orientation flat OF can be ground correctly and in conformity with a designed value by making the workpiece 10 get near to or away from the cutter 2 as occasion demands. Further, it becomes possible to grind an orientation flat OF having a complicated shape by means only of the two-axis control of the straight reciprocating movement in Y-axis direction and the rotation angle 8. In this instance, a production efficiency is about one sheet per minute for a silicone wafer having one orientation flat OF.

Figure 7:
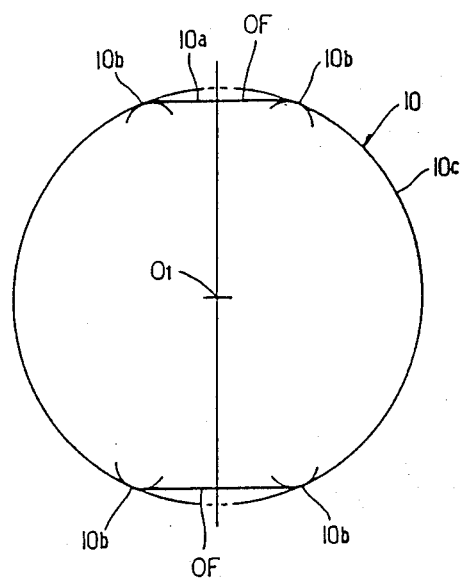
FIG. 7 is an explanatory diagram of a case where two orientation flats are cut out from the workpiece according to the invention.
Figure 8:
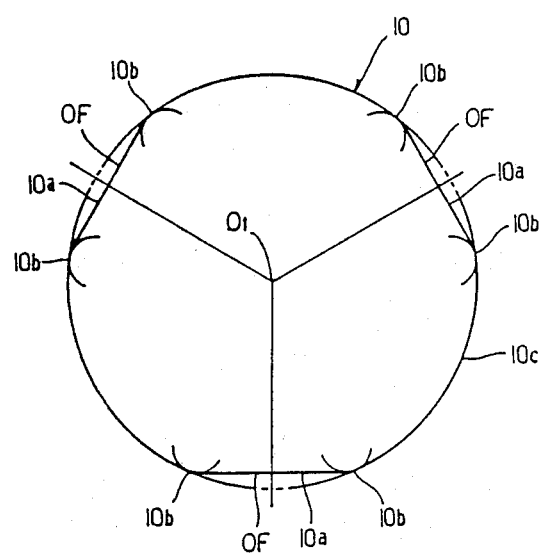
FIG. 8 is an explanatory diagram of a case where three orientation flats are cut from the workpiece according to the invention.
Figure 9:
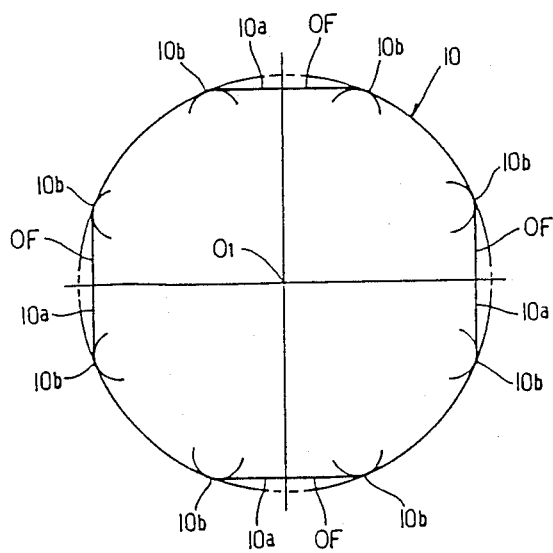
FIG. 9 is an explanatory diagram of a case where four orientation flats are cut from the workpiece according to the invention.
Figure 10:
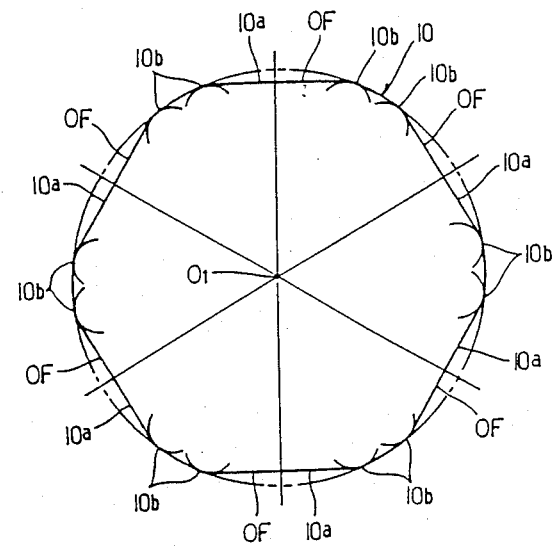
FIG. 10 is an explanatory diagram of a case where six orientation flats are cut from the workpiece according to the invention.

Incidentally, in the above description, a case where the orientation flat OF is formed at one place on the outer peripheral surface 10c of the workpiece 10 has been described. However, the invention is not limited to this case, but the orientation flat OF may be formed at two places according to an inputting method in the input device 8 as shown by FIG. 7, or the orientation flat OF may be formed at three places on the outer peripheral surface 10c of the workpiece 10 as shown by FIG. 8. Further, the orientation flat OF may be formed at four places thereon as shown by FIG. 9, or at six places as shown by FIG. 10, in the same manner.

Moreover, only the grinding work of the orientation flat OF has been described in the foregoing description. However, it is naturally possible to grind the entire outer peripheral surface 10c of the workpiece 10 with a specified grinding allowance left around the outer peripheral surface 10c. Furthermore; in case when the diameter D of the cutter 2, the radius R of the workpiece 10, the length l of straight portion 10a of the orientation flat OF and the radius of curvature r of the circular-arc portion 10b are changed; the grinding work can be carried on without accompanying any complicated preparation work by inputting these data in the input device 8, so that the preparation work for a lot change of the workpiece 10 can be extremely simplified.

Incidentally, in the above-mentioned preferred embodiment, the description has been made on the assumption that the workpiece 10 is the wafer. However, it goes without saying that said workpiece may be any other material such as a metal plate, a glass plate, a glass epoxy resin plate, a ceramic plate etc.

Effect of the Invention

Both the straight portion and the circular-arc portion of the orientation flat of the workpiece can be ground by the two-axis control in the rotation direction ($\theta$) and the longitudinal direction (Y-axis). Consequently, all the disadvantages accompanied by the conventional copying master system and the three-axis control NC machine can be eliminated. Further, when dimensions of completed products are changed, the necessary operation is only to input the diameter or radius of the workpiece, the length of straight portion of the orientation flat and the radius of curvature of the circular-arc portion in the input device. Therefore, the preparation work can be simplified extremely, and the working efficiency and precision can be improved. Moreover, the apparatus can be reduced in its volume, weight and manufacturing cost by about 30% as compared with the conventional NC grinding machine.

Further, the adsorption system using vacuum is employed for securing the workpiece so that a possibility to give damage to the workpiece such as the wafer etc. can be eliminated and the operation can be simplified effectively. Furthermore, the orientation flat of the workpiece can be formed at plural places as occasion demands, so that polygonal products such as triangular, square, pentagonal and hexagonal products may be manufactured from the disc.

While the invention has been particularly shown and described in reference to preferred embodiments thereof, it will be understood by those skilled in the art that changes in form and details may be made therein without departing from the spirit and scope of the invention.

What is claimed is:

1. A method of grinding for forming a straight portion on a part of an outer peripheral surface of a disc-like workpiece which is defined as an orientation flat by means of an outer peripheral surface of a rotating round cutter, comprising the steps of:

obtaining a distance between a rotation center of said workpiece and a locus generated by a rotation center of said cutter which revolves while making contact with said relative to said orientation flat of said workpiece for establishing a cutting standard, wherein said step of obtaining said distance comprises the step of obtaining said distance as a functional of a rotation angle of said workpiece;

providing an operation program for memorizing of said function of said rotation angle in a computer;

inputting a diameter or radius of said cutter, a diameter or a radius of said workpiece, a length of straight portion of said orientation flat and a radius of curvature of a circular-arc portion at both sides thereof are in said computer;

computing said distance corresponding to the rotation angle by said computer while rotating said workpiece by a rotary servo-mechanism controlled by said computer; and forming said orientation flat only through mans of a two-axis control which comprises a rotation control of said workpiece and a unidirectional movement control of said workpiece by letting said workpiece get close to or away from said cutter through a rectilinear servo-mechanism based on said computer results.

2. A grinding method of orientation flat as set forth in claim 1, wherein said workpiece is a silicone wafer.

3. A grinding method of orientation flat as set forth in claim 1 or claim 2, wherein said workpiece is absorbed on a workpiece stand by means of a vacuum.

4. A grinding apparatus for forming a straight portion on a part of an outer peripheral surface of a disc-like workpiece which is defined as an orientation flat, comprising: a round cutter; a rotation drive mechanism for said cutter; a workpiece stand; a rotary servo-mechanism for rotating said workpiece stand; a rectilinear servo-mechanism for letting said workpiece stand get close to or away from said cutter; an input device for enabling an input operation of at least a diameter or a radius of said cutter, a diameter or a radius of said workpiece, a length of a straight portion of an orientation flat of said workpiece and a radius of a circular-arc portion at both sides thereof; and a computer for computing a distance between a rotation center of said workpiece and a local generated by a rotation center of said cutter which revolves while making contact with and relative to the orientation flat of said workpiece for establishing a cutting standard for said grinding apparatus, as a function of a rotation angle of said workpiece, wherein said computer previously memorizing its operation program and being electrically connected to said rotary servo-mechanism, said rectilinear servo-mechanism and said input device; wherein said rotary servo-mechanism and said rectilinear servo-mechanism being controlled by said computer to form said orientation flat by means of a two-axis control of a rotation and a unidirectional movement of said workpiece.

* * * * *